US011466357B2

United States Patent
Moraes et al.

(10) Patent No.: US 11,466,357 B2
(45) Date of Patent: Oct. 11, 2022

(54) TERNARY TM-DIBORIDE COATING FILMS

(71) Applicant: Oerlikon Surface Solutions AG, Pfäffikon, Pfäffikon (CH)

(72) Inventors: Vincent Moraes, Vienna (AT); Paul Heinz Mayrhofer, Neckenmarkt (AT); Hamid Bolvardi, Chur (CH); Mirjam Arndt, Bad Ragaz (CH); Peter Polcik, Reutte (AT)

(73) Assignee: Oerlikon Surface Solutions AG, Pfäffikon, Pfaffikon (CH)

( * ) Notice: Subject to any disclaimer, the term of this patent is extended or adjusted under 35 U.S.C. 154(b) by 186 days.

(21) Appl. No.: 16/754,105

(22) PCT Filed: Oct. 8, 2018

(86) PCT No.: PCT/EP2018/077335
§ 371 (c)(1),
(2) Date: Apr. 6, 2020

(87) PCT Pub. No.: WO2019/068933
PCT Pub. Date: Apr. 11, 2019

(65) Prior Publication Data
US 2020/0332407 A1  Oct. 22, 2020

Related U.S. Application Data

(60) Provisional application No. 62/660,390, filed on Apr. 20, 2018, provisional application No. 62/569,064, filed on Oct. 6, 2017.

(51) Int. Cl.
*C23C 14/06* (2006.01)
*C23C 14/35* (2006.01)

(52) U.S. Cl.
CPC .......... *C23C 14/067* (2013.01); *C23C 14/352* (2013.01)

(58) Field of Classification Search
CPC ..... B23B 27/14; B23B 27/148; C23C 14/067; C23C 14/352; C23C 28/044
USPC ........................................ 428/697, 698, 699
See application file for complete search history.

(56) References Cited

U.S. PATENT DOCUMENTS

2015/0167176 A1* 6/2015 Hampsch .............. C23C 28/347
428/216

FOREIGN PATENT DOCUMENTS

CN       104513954 A      4/2015

OTHER PUBLICATIONS

Akpoov et al "Effects of Variable Boron Concentration on the Properties of Superhard Tungsten Tetraboride" Journal of the American Chemical Soceity, 139, pp. 17120-17127 (Year: 2017).*
H. Euchner et al. "Designing Thin Film Materials—Ternary Borides from First Principles" Thin Solid Films, Apr. 1, 2015, pp. 46-49, vol. 584, Elsevier.
Chunlei Jiang "Preparation and Characterization of Superhard AIB2-Type WB2 Nanocomposite Coatings" Physica Status Solidi A, Mar. 7, 2013, pp. 1221-1227, vol. 210, No. 6, Wiley-VCH Verlag GmbH & Co KGaA.

(Continued)

Primary Examiner — Archene A Turner

(57) ABSTRACT

The present invention relates to coatings comprising or consisting of one or more ternary TM-diboride coating films. The ternary TM-diboride coating films showing exceptionally high phase stability and mechanical properties, even at high temperatures or even after exposition to high temperatures.

11 Claims, 12 Drawing Sheets

(56) References Cited

OTHER PUBLICATIONS

Figure 1:
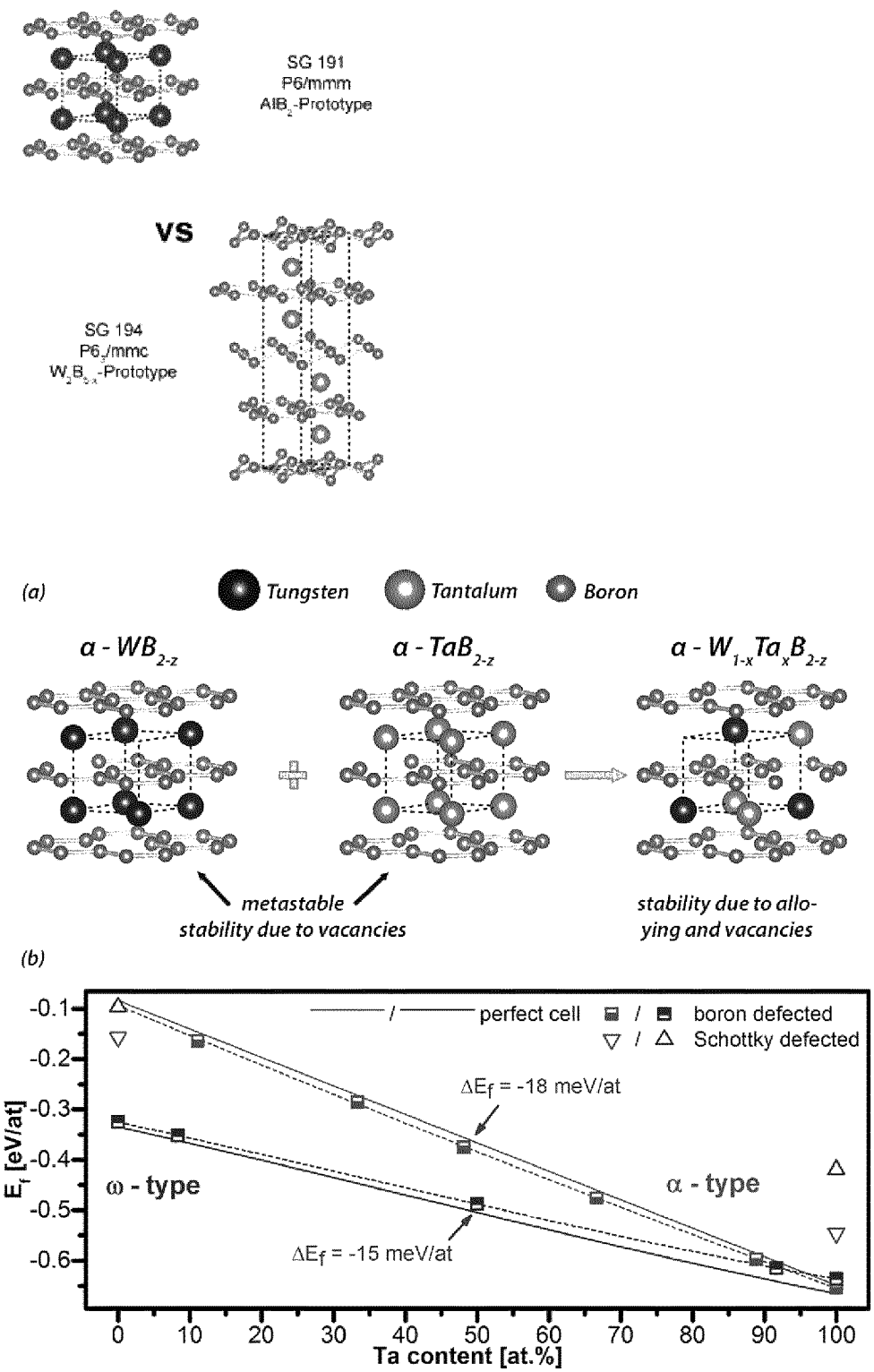

O.V. Sobol "Control of the Structure and Stress State of Thin Films and Coatings in the Process of Their Preparation by Ion-Plasma Methods" Physics of the Solid State, Jul. 1, 2011, pp. 1464-1473, vol. 53, No. 7, Pleiades Publishing, Ltd.
O.V. Sobol et al. "Peculiarities of Structure State and Mechanical Characteristics in Ion-Plasma Condensates of Quasibinary System Borides W2B5-TiB2" Science of Sintering, Jan. 1, 2006, pp. 63-72, vol. 38.
A. Newirkowez et al. "(Ti,W,Cr)B2 Coatings Produced by DC Magnetron Sputtering" Thin Solid Films, Aug. 25, 2011, pp. 1775-1778, vol. 520 Elsevier.

\* cited by examiner

TERNARY TM-DIBORIDE COATING FILMS

The present invention relates to coatings comprising or consisting of one or more ternary TM-diboride coating films (TM is used in the context of the present invention as the abbreviation of transition metal or transition metals). The ternary TM-diboride coating films comprising tungsten and tantalum as transition metals and showing exceptionally high phase stability and mechanical properties, even at high temperatures or even after exposition to high temperatures.

In the context of the present invention high temperatures are temperatures of 800° C. or higher than 800° C., more in particular of 1000° C. or higher than 1000° C. In the context of the present invention the term high temperatures refers in particular to temperatures values in the range between 1000° C. and 1400° C. but comprising the temperature values 1000° C. and 1400° C., respectively.

FIELD OF TECHNOLOGY

Since many years, transition metal nitrides experience great success in thin film industry. Their outstanding properties like high hardness, good oxidation resistance, high thermal stability, and abrasion resistance make them widely suitable for various applications such as protective coatings for cutting and milling tools, or for microelectronic applications. The never-ending demand for increasing the efficiency of industrial process, e.g., higher feedthroughs during machining—which implies the increase in cutting speed and therefore increased temperatures—still asks for further materials science based developments of protective coatings. Hence, industry calls for new material classes exceeding the possibilities of nitrides.

The refractory nature of transition metal borides attracted interest in academia as well as industry for the use as thin film materials in various applications [1]. Motivated by their highly attractive properties such as high hardness [2], chemical stability [3] and good (in respect to semiconductors) electrical and thermal conductivity [4], these material systems fuel research in application oriented coating development. Their huge variety of outstanding properties [5] further allows for target-driven developments as protective or wear resistant coatings. Since many years, research activities concentrated on TM-nitrides leading to great success in thin film industry (e.g. TiN, Ti—Al—N, Al—Cr—N) [6-8], new alternatives are highly desired to enter new fields of applications. Hence, a knowledge-based exploration of TM-borides is necessary to investigate new multinary systems with novel properties, such as recently reported for high entropy diborides [9].

Within the huge stoichiometric variety of borides (TMB, $TMB_2$, $TMB_4$, $TMB_{14}$, etc.) one class—the diborides—promises outstanding mechanical properties [2,10,11]. For example, several computational studies pointed out, that $ReB_2$ is the most incompressible material known so far, competing or even exceeding the properties of diamond [12,13]. These $TMB_2$ compounds are known to crystallize in two related hexagonal structures: $\alpha$-$AlB_2$-prototype (P6/mmm, SG-191) or $\omega$-$W_2B_{5-z}$-prototype (P63/mmc, SG-194) [14].

$WB_2$ has been classified in its metastable $\alpha$-structure as a highly ductile material [15] according to the semi-empirical ductility criteria by Pettifort [16], Pugh [17] and Frantsevich [18,19].

In addition, $WB_2$ is reported in several studies to crystallize in the $AlB_2$ structure type when deposited as coating film [20-23]. Similar to the concept of yttrium stabilized zirconia (YSZ) [24,25], where a specific alloying element (in this case Yttrium) is used to stabilize a metastable structure (achieving the cubic high temperature modification at room temperature [24]).

The coating shown in the state of the art does however still not always have a good enough phase stability and superior mechanical properties, e.g. H>40 GPa, especially at high temperatures.

Therefore, the underlying problem of the invention is to provide a coating that shows high phase stability and superior mechanical properties even at temperatures above 1000° C.

DESCRIPTION OF THE PRESENT INVENTION

The present invention provides coated substrates comprising a coated surface with a coating comprising or consisting of one or more ternary TM-diboride coating films, wherein TM refers to two different transition metals, preferably tungsten and tantalum, or vanadium and tungsten, or vanadium and tantalum.

The ternary TM-diboride coating films according to the present invention show exceptionally high phase stability and mechanical properties, even at high temperatures or even after exposition to high temperatures.

According to a preferred embodiment of the present invention the at least one ternary TM-diboride coating film has chemical composition described by the formula $W_{1-x}Ta_xB_2$, where x is the fraction coefficient indicating the content of tantalum in relation to tungsten and likewise 1-x is the fraction coefficient indicating the content of tungsten in relation to tantalum, when the sum of the content of tantalum and the content of tungsten in atomic percentage are considered to be 100%. In this regard and according to this preferred embodiment x being in the range between 0.00 and 0.45 preferably, between 0.05 and 0.45, including the border values (corresponding to a range in atomic percentage of between 5 at. % and 45 at. %), which means that $0.00 \leq x \leq 0.45$, preferably $0.05 \leq x \leq 0.45$.

According to another preferred embodiment of the present invention the at least one ternary TM-diboride coating film has chemical composition described by the formula $V_{1-x}W_xB_2$ x is the fraction coefficient indicating the content of tungsten respective tantalum in relation to vanadium and likewise 1-x is the fraction coefficient indicating the content of vanadium in relation to tungsten respective tantalum, when the sum of the content of tungsten respective tantalum and the content of vanadium in atomic percentage are considered to be 100%. In this regard and according to this preferred embodiment x being in the range between 0.00 and 0.45, preferably between 0.05 and 0.45, including the border values (corresponding to a range in atomic percentage of between 5 at. % and 45 at. %), which means that $0.00 \leq x \leq 0.45$, preferably $0.05 \leq x \leq 0.45$.

The inventors discovered that the very positive effect on the hardness and toughness of the inventive coatings is not significant when x is lower than 0.05.

Furthermore, the inventors discovered that by x higher than 0.45 the formation of a ternary phase, in particular the formation of a singular ternary phase of TM-diboride cannot be ensured.

According to a further preferred embodiment of the present invention the value of the tantalum content corresponds to a coefficient x in the following range: $0.05 \leq x \leq 0.26$.

For the formation of a TM-diboride as well as for the formation of a ternary TM-diboride the quantity of mols of boron must be twice as high as the quantity of mols of the transition metal or the sum of the transition metals (TM). However, usually it is difficult to detect boron content. For this or other reasons the measured quantity of boron can be lightly lower than expected (indicating a sub-stoichometry in relation to boron). Therefore, in the present description of the invention the formula for describing the chemical composition of the ternary TM-diboride according to the above mentioned preferred embodiment of the invention was also written as following: $W_{1-x}Ta_xB_{2-z}$, where z can be higher than cero in the case of a sub-stoichiometric content of boron. In other words, z is a coefficient that is different from cero when there is a deviation in relation to the measured boron content from the stoichiometric chemical composition $W_{1-x}Ta_xB_2$ (with z=0 indicating no deviation from stoichiometry). A coefficient z higher than cero indicates a sub-stoichiometric boron content and likewise a coefficient z lower than cero indicates a hyper-stoichiometric boron content.

Preferably the coefficient z should be closer to cero as possible and in any case not outside of following z values range: $0.03 \leq z \leq -0.03$.

Ternary TM-borides or ternary TM-diborides are rather unexplored compared with their nitride-based counterparts.

The inventive ternary TM-diboride coatings were deposited via physical vapor deposition and were found to show excellent mechanical and thermomechanical properties.

Considering the huge span of possibilities and properties for designing ternary diborides, ab initio calculations (Density Functional Theory, DFT) were used for obtaining fundamental properties such as the energy of formation, lattice parameters, and equilibrium volume.

A huge drawback, when considering TM-diborides for hard coating applications is the pronounced brittle behavior of this material class.

For producing ternary TM-diborides with increased toughness, the inventors decided to preselect binary diborides, which can contribute to enhance ductility.

With this intention possible binary candidates from theory were preselected, which could be able to be used for performing target-oriented experiments.

Whereas early TM-diborides tend to crystallize with SG-191—with metal layers divided by planar hexagonal boron layers, $AlB_2$ is the prototype—, late TM-diborides tend to crystallize with SG-194—where the boron-layers are alternatingly puckered or flat, with $W_2B_5$ being the prototype—(see FIG. 1).

In other words, early $TMB_2$ (such as $TiB_2$, $ZrB_2$, $VB_2$, etc.) crystallizes in the α-type with metal layers separated by flat hexagonal boron planes, whereas late $TMB_2$ ($WB_2$, $ReB_2$, $TaB_2$, etc.) exhibits higher chemical stability in the ω-type, where the metal layers are separated by alternating flat and puckered hexagonal boron planes (see FIG. 1a).

Therefore, these two different structures were used to set up a semi-automated high-throughput ab initio calculation (using the VASP code) covering all different transition metal diboride combinations, regardless whether they are thermodynamically stable or not.

By combining different programming languages (python and bash) in a first step, the structures where fully converged, to assure accurate results. To find the optimized lattice parameters and the energy of formation of their ground state, the pressure dependence on their volume was calculated and fitted according to the Birch-Murnaghan equation. This procedure also provided the bulk moduli for all the TM-diborides. The data nicely reveal trends in electronic structure when comparing the different compounds.

To get a closer insight on the stability of the different compounds when introducing defects (which are highly present in physical vapour deposited coating films), the trends for removing a single atom of the different species (flat and puckered boron planes, metal planes) were calculated. Hence, special quasi-random structures (SQS) approach was used to create 3×3×3 and 3×3×1 (81 (80) or 108 (107) atom containing) supercells, for the SG-191 and SG-194 structure, respectively. In a concluding step, the elastic constants were determined by applying linear independent coupling strains suggested by Yu et al. Furthermore, by adopting different criteria on the data suggested by Pugh, Pettifor, and Frantsevich, the compounds can be classified (relatively to themselves) in brittle and ductile.

After analyzing the data sorted by the different ductility criteria, good mechanical properties and feasibility, $WB_2$ was chosen as a most promising candidate. An experimental study, analyzing the structure of this compound showed that contrary to bulk experiments, $WB_2$ crystallizes in SG-191 when deposited via physical vapor deposition.

The inventors had the idea of using Ta for stabilizing the metastable α-$AlB_2$-structure with lowest cost on ductility.

The inventors found that surprisingly the very negative energy of formation (Ef) for α-$TaB_2$ as compared to α-$WB_2$ and its likewise energetic privilege for vacancies, supports stabilizing α-type $W_{1-x}Ta_xB_{2-z}$ solid solutions in coating films (see FIG. 1b).

In order to stabilize the deposited metastable structure and additionally preserving the good mechanical properties, at elevated temperatures, the data obtained from the calculations suggest $TaB_2$ as a most promising candidate to combine with $WB_2$.

Additionally, based on the achieved calculated results, $V_{1-x}W_xB_2$ thin films concerning the thermo-mechanical properties in a defined compositional range were investigated. $VB_2$ is a highly interesting diboride, due to its high degree of covalent bonds [41, 42] suggesting a high hardness and its excellent tribological behavior due to the formation of $B_2O_3$ in tribo-contacts [43]

Therefore, a home-built magnetron sputtering system, equipped with a 6-inch $WB_2$- and 6-inch $TaB_2$ compound target was used, to prepare ternary $W_{1-x}Ta_xB_2$ coating films (with x ranging from 0 to 100 at. %). For $V_{1-x}W_xB_2$ thin films a 3-inch $VB_2$ as well as a 2-inch $W_2B_{5-x}$ compound target were used. The deposited films where analyzed with focus on their structure and mechanical properties using X-ray diffraction and nanoindentation.

Within the scope of the present invention, the stabilization of the metastable structure α-$WB_2$ with Ta as an alloying element was analyzed and innovative ternary TM-diboride coating films were synthesized. Furthermore, the rarely documented α-$WB_2$ structure and the influence of vacancies on the binary as well as the ternary $W_{1-x}Ta_xB_{2-z}$ system (with x ranging from 0 to 0.40) was analyzed. To gain an in-depth understanding the experimentally observed results were correlated with ab initio density functional theory (DFT) calculations.

For studying the influence of Ta alloying and vacancies on α- and ω-$W_{1-x}Ta_xB_{2-z}$ structures, DFT coded in VASP (Vienna Ab initio Simulation Package [28,29]) was applied. The projected augmented waves method within the generalized gradient approximation (PAW-PBE [30]) was used.

The influence of vacancies and Ta-alloying is studied by applying the SQS-approach [31] creating 3×3×1 supercells containing 108 atoms (ω-type) as well as 3×3×3 supercells containing 81 atoms (α-type). Boron vacancy concentrations of 1.9 at. % (α-type) and 1.4 at. % (ω-type) and metal vacancy concentrations of 3.7 at. % (α-type) and 2.8 at. % (ω-type) were obtained by simply removing the different species from the corresponding sublattice. All structures were carefully relaxed to ensure energy convergence of less than a few meV/at.

FIG. 1b shows the energy of formation, $E_f$, of the ternary $W_{1-x}Ta_xB_{2-z}$ system calculated for the α- and ω-structures, considering perfect and defected cells referring to full and dashed lines, respectively. With increasing Ta content the α-structure as well as the ω-structure show clearly more negative $E_f$ values, suggesting a strong stabilizing effect in both structure types due to the Ta alloying. Whereas for the $WB_2$ binary system the difference in $E_f$ of the α and ω structure is huge ($\Delta E_{f(α-ω)}=-0.26$ eV/at) it is negligible ($\Delta E_{f(α-ω)}=-0.02$ eV/at) for binary $TaB_2$. Thus, $WB_2$ clearly prefers the ω-structure while $TaB_2$ has almost the same $E_f$ for the α- and ω-structure. By introducing boron vacancies, $E_f$ of the α-structure significantly becomes more negative, but $E_f$ of the ω-structure becomes less negative, along the entire W—Ta composition range. The boron deficiency influences the $E_f$ values of the α- and ω-structure sufficiently enough, so that the high alloyed Ta region (>90 at. % Ta) prefers already α over ω. Metal vacancies penalize the phase stability) of the ω-structure in the full compositional range of $W_{1-x}Ta_xB_2$, but the α-structure is only influenced in the low Ta-alloyed region (e.g., $\Delta E_f=-0.025$ eV/at between α and 3.7 at. % metal-deficient-α. The high alloyed region shows only $\Delta E_f=+0.002$ eV/at between α and 3.7 at. % metal-deficient-α. This is in excellent agreement with experiments, stating the off-stoichiometry due to boron deficiency in α-$TaB_2$ coating films [32]. As the boron and metal vacancies show a different behavior on the energy of formation, we additionally studied Schottky-defects (stoichiometric defects—e.g., one metal and two boron vacancies) in the present calculations. At a Schottky-concentration of about 10 at. % (see FIG. 1b) the $E_f$ of $WB_2$ becomes more negative for the α-structure but less negative for the ω-structure, but $E_f$ of $TaB_2$ becomes less negative for both structures. Hence, with respect to the α-structure the phase stability increases for α-$WB_2$ whereas it decreases for α-$TaB_2$.

The computational obtained data was correlated with experimental values.

In the context of the present invention $W_{1-x}Ta_xB_{2-z}$ coating films were synthesized by using a magnetron sputtering system of the type Balzers INNOVA and as source material composite targets ($TaB_2$, $WB_2$ [+1 wt. % C]) manufactured by Plansee Composite Materials GmbH were used. The bottom-up configuration (mean substrate-target distance of 10 cm) holds a confocal arrangement of four magnetron sources (2×3" and 2×6").

The sputtering process was performed in Ar atmosphere (30 sccm flow rate, 99.999% purity) at a working gas pressure of 0.4 Pa and a constant temperature of $T_{heater}=700°$ C. (corresponding to $T_{sub}=400°$ C. measured directly on the substrate surface). For all coatings, a base pressure below $3·10^4$ Pa was ensured, and the target power was varied from 0 to 11 W/cm² on each of the targets to achieve the different compositions. Additionally, a bias voltage of −50 V was applied to the rotating substrate holder (0.25 Hz). Prior to all depositions, the substrates were ultrasonically pre-cleaned in acetone and ethanol. In addition, Ar-ion etching within the deposition system applying a potential of −750 V in Ar atmosphere at 6 Pa was conducted for 10 min.

For detailed investigations on the structure and chemical compositions, the coatings were deposited on AISI steel foil and Si substrates (100 oriented).

For substrate-interference free analysis the low-alloyed steel foil was dissolved in hydrochloric acid to obtain substrate-free coating powders.

To analyze the obtained structure types, XRD measurements were performed with a PANalytical XPert Pro MPD (θ-θ Diffraktometer) equipped with a Cu—$K_α$ ($\lambda=1.54$ Å) radiation source.

To achieve a high accuracy concerning the lattice parameters, the coating powders were mixed with a reference powder (Si, NIST-SRM 640d) for the XRD analysis.

The chemical compositions of all coating films was investigated by Time-of-Flight Elastic Recoil Detection Analysis (TOF-ERDA) with a recoil detection angle of 45° and a 36 MeV $I^{8+}$ primary ion beam. This method was chosen, to achieve highest accuracy for boron, which is found to be ±1 at. % for absolute measurements free from standards, mainly due to uncertainties. Due to the low-resolution limit of TOF-ERDA for the present metals (to separate tantalum and tungsten), the metal composition was additionally investigated using energy dispersive X-ray spectroscopy (EDS, FEI Quanta 200, 10 kV accelerating voltage).

FIG. 2a shows XRD patterns of powder of the inventive $W_{1-x}Ta_xB_{2-z}$ coating films in the low alloyed Ta region [with Ta contents up to ≈40 at. % Ta on the metal sublattice—$W_{0.60}Ta_{0.40}B_{2-z}$ (this composition was extrapolated from ERDA and EDS data and target power measurements of the other samples)].

Clearly, the measurements reveal the single-phase α-structure for all coatings up to a Ta content of 26 at. %. For higher Ta contents (>26 at. % Ta) the peaks still can be accounted to the crystallographic data found by Woods (α-$AlB_2$ structured $WB_2$) but due to their asymmetric shape (especially on the left side of the 101 XRD peak) this $W_{0.60}Ta_{0.40}B_{2-z}$ coating cannot be ensured to be single-phased. Therefore, in terms of discussing the structure, we concentrate on the data shown in FIG. 2a. Regarding Vegard's linear relationship for substitutional solid solutions [33], the experimentally obtained lattice parameters of $W_{0.74}Ta_{0.26}B_{2-z}$ (the value for a and c where taken for annealed samples, $T_a=800°$ C. for 960 min in vacuum to ensure stress-free lattice constants), are in excellent agreement to theory, underlining the formation of a single-phase solid solution. This $W_{0.60}Ta_{0.40}B_{2-z}$ coating cannot be ensured to be single-phased.

With increasing Ta content, the growth orientation changes from rather random to preferred 101 orientation. The rather broad XRD peaks, suggest a very small grain size for all coatings studied. FIGS. 2b and c display the corresponding lattice constants a and c for the different chemical compositions, respectively. The results for a and c of as deposited α-$WB_2$ are in excellent agreement with the values published by Woods [20], with only a deviation of ~0.005 Å for a and ~0.017 Å for c, the exact chemical composition was not determined by Woods.

For proofing the stabilization effect of alloying Ta to the α-$WB_{2-z}$ structure, we conducted vacuum annealing treatments of the as deposited coatings (in substrate-free powder form). Therefore, we used a Centorr LF22-2000 vacuum furnace with a maximum operation temperature of about 1660° C. to perform annealing experiments at peak temperatures ($T_a$) of 800, 1000, 1200, and 1400° C. The heating rate was set to 20 Kmin$^{-1}$ and after 1 h at the corresponding peak temperature (to minimize kinetic restrictions), the cooling was performed passively (simply turning off the heater).

Figure 3:
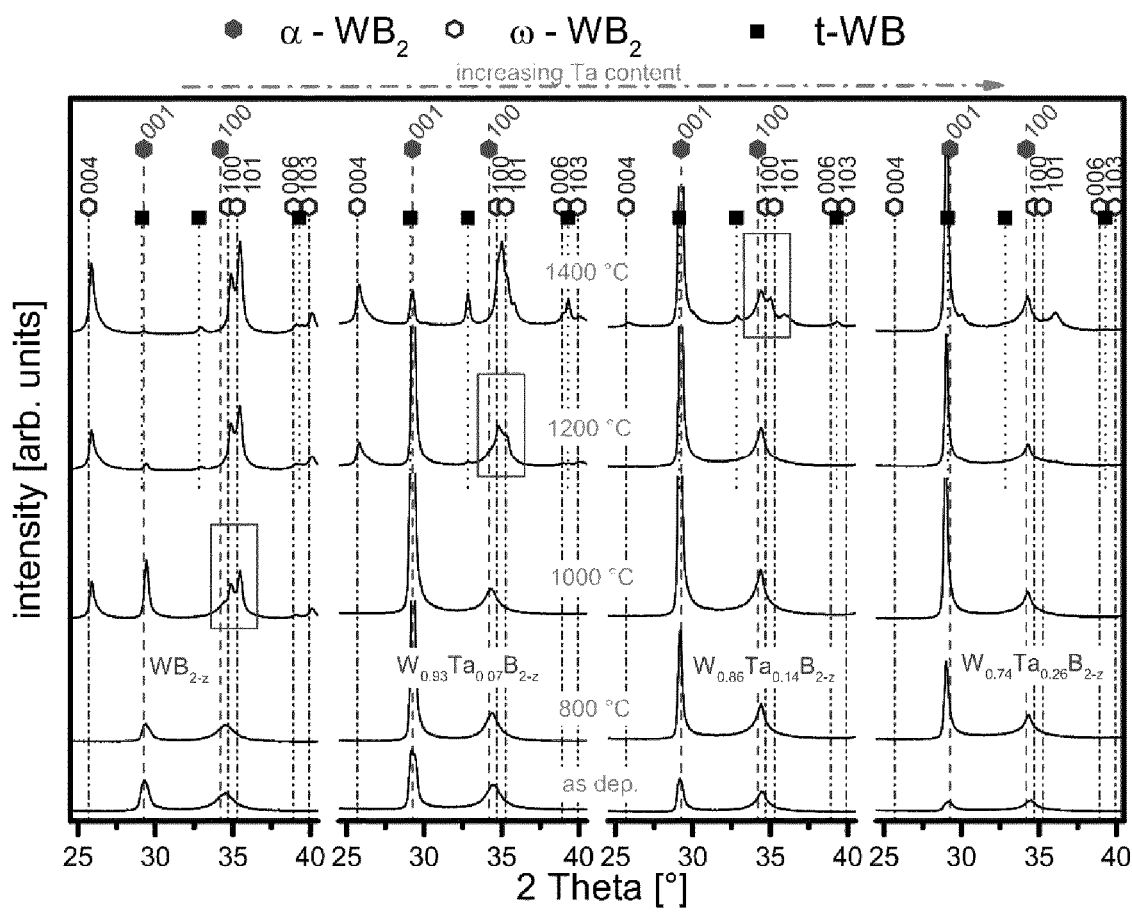

In FIG. 3, we show the structural evolution of the four different compositions ($WB_{2-z}$, $W_{0.93}Ta_{0.07}B_{2-z}$, $W_{0.86}Ta_{0.14}B_{2-z}$, and $W_{0.74}Ta_{0.26}B_{2-z}$) from the as deposited state towards the vacuum annealed states (at different temperatures). All compositions remain in their single-phased α-structure up to 800° C. At 1000° C. the binary metastable α-$WB_{2-z}$ decomposes to form t-WB and ω-$W_2B_{5-z}$ highlighted by the red rectangle for the 100 XRD peak of $WB_{2-z}$ [36]. This already suggests (with the help of the equilibrium phase diagram), that the B content in the α-$WB_{2-z}$ is below 66.6 at. %. Hence, the $WB_{2-z}$ coating films grow in their metastable α-structure due to their substoichiometry in boron. This underlines the computational results stating that the α-structure likes, but the ω-structure dislikes the formation of boron vacancies, especially boron ones below the $WB_2$ stoichiometric composition [15]. Based on these combined computational and experimental results we envision that the metastable α-$WB_{2-z}$ phase field is extended to lower B-contents than the stable ω-$W_2B_{5-z}$ phase field. Already the addition of just 7 at. % Ta to the metal sublattice postpones the decomposition and transformation of the α-structure to 1200° C. Further alloying of Ta even increases the decomposition temperature and ensures the coating film materials for Ta contents above 14 at. % to be single-phased α-structured even up to 1200° C. These results nicely prove the concept of stabilizing phases due to the addition of an appropriate alloying element, which was chosen based on calculations. As the B content of the $WB_{2-z}$ coating is with 59.3 at. % significantly below 66.6 at. % (FIG. 4a), and thus the driving force for a decomposition towards t-WB and ω-$W_2B_{5-z}$ should be even higher, any stabilization effect by Ta can be seen as even more significant.

For further investigations on the presence of boron vacancies within the α-$W_{1-x}Ta_xB_{2-z}$ system, we present the change in lattice parameters (see FIGS. 4b and c) with increasing Ta content with respect to the unalloyed α-$WB_{2-z}$ (comparison of calculated and experimental data). Clearly, the results obtained for a perfect cell suggest a pronounced decrease in lattice parameter c with increasing Ta content (full data points in FIG. 4b). By introducing one boron vacancy into the supercell (corresponding to 1.9 at. % boron vacancies) the change in lattice parameter c significantly decreases (open data points). Contrary, the presence of metal vacancies (equivalent to 3.7 at. % on the metal sublattice) do not follow a clear trend (half-filled data points). However, the random behavior of the lattice parameter can be attributed to the decreasing favor of metal vacancies with increasing Ta content in the coatings [15]. Nevertheless, contrary to the calculations, the experimental data suggest a clear increase in lattice parameter c, almost to a linear interpolation between $WB_2$ and $TaB_2$ (see the Vegard's line).

For a more detailed comparison between the experimental deposited compositions and the calculations, we adjusted the chemical composition of the SQS structures according to the data obtained by the experiments—a slightly increased and decreased boron population is used (indicated by the grey shaded area in FIG. 4a). The measured boron content reveals a pronounced non-stoichiometric metal/boron-ratio—decreasing with increasing Ta content—we adjusted the (experimental) composition by introducing boron vacancies. Here, we should mention that the slight drop in the boron content of the $W_{0.93}Ta_{0.07}B_{2-z}$ coating (see FIG. 4a), which is attributed to the change in the experimental setup by using two separate (each other influencing) targets. Moreover, comparing the pronounced deviation of the experimental to the calculated (Vegard's line) change in lattice parameter, the data for the $W_{0.93}Ta_{0.07}B_{1.76}$ coating reveals the highest offset. The calculated results accounting the experimental compositions show a distinct trend reversal. Whereas initially the c lattice parameter still decreases (from $WB_{2-z}$ to $W_{0.93}Ta_{0.07}B_{2-z}$), it clearly increases upon adding more Ta, according to the experimental results. Now (using the experimentally obtained substoichiometry for the DFT calculations) also the lattice parameter a (FIG. 4c) exhibits a smaller increase with increasing Ta content, according to the experiments, supporting the conclusions drawn from the lattice parameter c dependence. Especially the lattice parameter c clearly shows that an increase with increasing Ta content (as obtained by experiments) is only obtained when introducing vacancies. This nicely shows the need for considering point defects such as vacancies when comparing computations and experiments.

In conclusion, we show that PVD $W_{1-x}Ta_xB_{2-z}$ coating films crystallize in their metastable α-structure and are single-phased (i.e., solid solution) up to a Ta content of 26 at. %. The experimentally obtained lattice parameters (excellent agreement for α-$WB_{2-z}$ with previous reports) increase with increasing Ta content. This can only be obtained by DFT when considering the formation of boron vacancies. Moreover, the addition of tantalum shifts the decomposition and phase transformation of the metastable α-phase from 800-1000° C. (for $WB_{2-z}$) to 1200-1400° C. ($W_{0.74}Ta_{0.26}B_{2-z}$). Again, this can nicely be explained by DFT, which shows that the stability of α-structured $W_{1-x}Ta_xB_{2-z}$ is strongly influenced by vacancies and the Ta content. Whereas the entire W—Ta composition range of α-$W_{1-x}Ta_xB_{2-z}$ is more stable for substoichiometric compositions (i.e., considering boron vacancies) as compared with their stoichiometric counterparts, the formation of metal vacancies is only favorable for tantalum contents≤50 at. % (i.e., x≤0.5).

In FIGS. 8a and b, the two competing structure types—α-$TMB_2$ and ω-$TMB_2$—and the corresponding lattice constants for the binary systems $VB_2$ and $WB_2$ are presented, respectively. The structures can be nicely distinguished by the presence of the alternating puckered boron plane of the ω-structure (FIG. 8b). The presence of this puckered boron plane, leads to an increase in equilibrium volume from 8.92 Å/at (α-type) to 9.29 Å/at (ω-type) for $WB_2$ and from 7:88 Å/at (α-type) to 8.39 Å/at (ω-type) for $VB_2$. This corresponds to an increase of 4.1% ($WB_2$) and 6.4% ($VB_2$) when transforming from α- to the ω-structure. Furthermore, by considering the experimentally found lattice constants of α-$WB_2$ [44], which is comparable to α-$VB_2$, the increase—when transforming from the α-type to the ω-type—can be even 17.9%. Comparing these results to the well-established concept of $ZrO_2$-toughened ceramics—where analogous the transformation from a metastable structure tetragonal) to a stable one (monoclinic) causes a toughening effect due to the increase in Volume by 4.5%—the V-W-B system is almost ideally for allowing phase-transformation related hardening or toughening effects [45, 46]. FIG. 8c shows the impact of Schottky defects and the corresponding vacancy concentration on the energy of formation, $E_f$, for the two hexagonal structures. For defect-free structures, $VB_2$eα-type over the ω-type but $WB_2$ prefers the ω-type. Furthermore, the distinct difference in $E_f$ reveals $VB_2$ as energetically more stable than $WB_2$, regardless of the structure and is amongst one of e α-$TMB_2$ [47]. Nevertheless, all studied e values, meaning that from the energetic point of view, the compounds could be formed in both structure-types.

For the $VB_2$ system (dark yellow data points) the presence of Schottky defects clearly denotes a pronounced increase in $E_f$ (towards the positive region) in the α- and in the ω-type. For $WB_2$ (dark blue data points), $E_f$ only increases with increasing Schottky defect concentration for the ω-type. But $E_f$ initially decreases with increasing Schottky defect concentration (up to approximately 10 at: %) for the α-type. The two $E_f$-vs-defect concentration curves for $WB_2$ (with α- or ω-type) cross at a vacancy concentration of approximately 8 at: %, from which on the α-type wins, see FIG. 8c.

When looking at the lattice constants for the α-type of both compounds, the influence of vacancies becomes significant. Whereas the calculated values for a and c in case of the defect-free $VB_2$—open yellow diamonds—are in excellent agreement with the experimental data (indicated by the dashed red lines), especially the lattice constant c (blue open diamonds) strongly differs from the experimental data for $WB_2$. Only at high vacancy concentration, the c lattice constant of $WB_2$ approximates the experimental values. These results highlight the impact of vacancies on the two transition metal diborides, and are in excellent agreement to our previous studies, where the impact of the individual species (boron and metal) were studied allowing similar conclusions [47]. The incorporation of vacancies when synthesizing ternary $V_{1-x}W_xB_2$ thin films by PVD, should act as an additional promoter for separating the tungsten and vanadium (metal species) at elevated temperatures, as $VB_2$ dislikes such structural defects.

FIGS. 9a,b,c, and d show cross-sectional TEM micrographs and corresponding SAED patterns (substrate near and surface near) of $VB_2$, $V_{0.95}W_{0.05}B_2$, $V_{0.87}W_{0.13}B_2$, and $V_{0.79}W_{0.21}B_2$, respectively. All coatings exhibit a distinct dense and columnar growth morphology, starting with fine columns at the substrate/interface region and emerging distinctively in size towards the surface. This can also clearly be seen from the SAED patterns with pronounced fully developed diffraction rings at the substrate interface (bottom pattern of (a),(b), (c), and (d)) and individual diffraction spots in the patterns towards the surface (top pattern of (a),(b), (c), and (d)). Furthermore, with increasing tungsten content, the columns become highly oriented and are slightly smaller (in width and length), resulting in a more fine-grained morphology. The SAED patterns reveal that all thin films deposited are single-phased α-structured (indicated by the green dashed circles), which is in good agreement to results obtained from X-ray diffraction (not shown here). In addition, based on the SAED patterns but especially from the X-ray diffraction patterns, the preferred c-axis (001) orientation can be identified. However, compared to the ab-initio obtained lattice constants of the individual binaries, a clear peak shift due to the formation of solid solutions (according to the Vegard's line of linear approximation of the lattice constants) is missing. Our previous study on α-$WB_2$ underlines this result showing almost similar lattice constants for α-$WB_2$ and α-$VB_2$. Due to the increasing power applied to the $W_2B_{5-x}$ target, the deposition rate increases from approximately 27 nm·min$^{-1}$ to approximately 39 nm·min$^{-1}$ resulting in coating thicknesses of 1650 nm to 2340 nm after 60 min of deposition.

Figure 9:
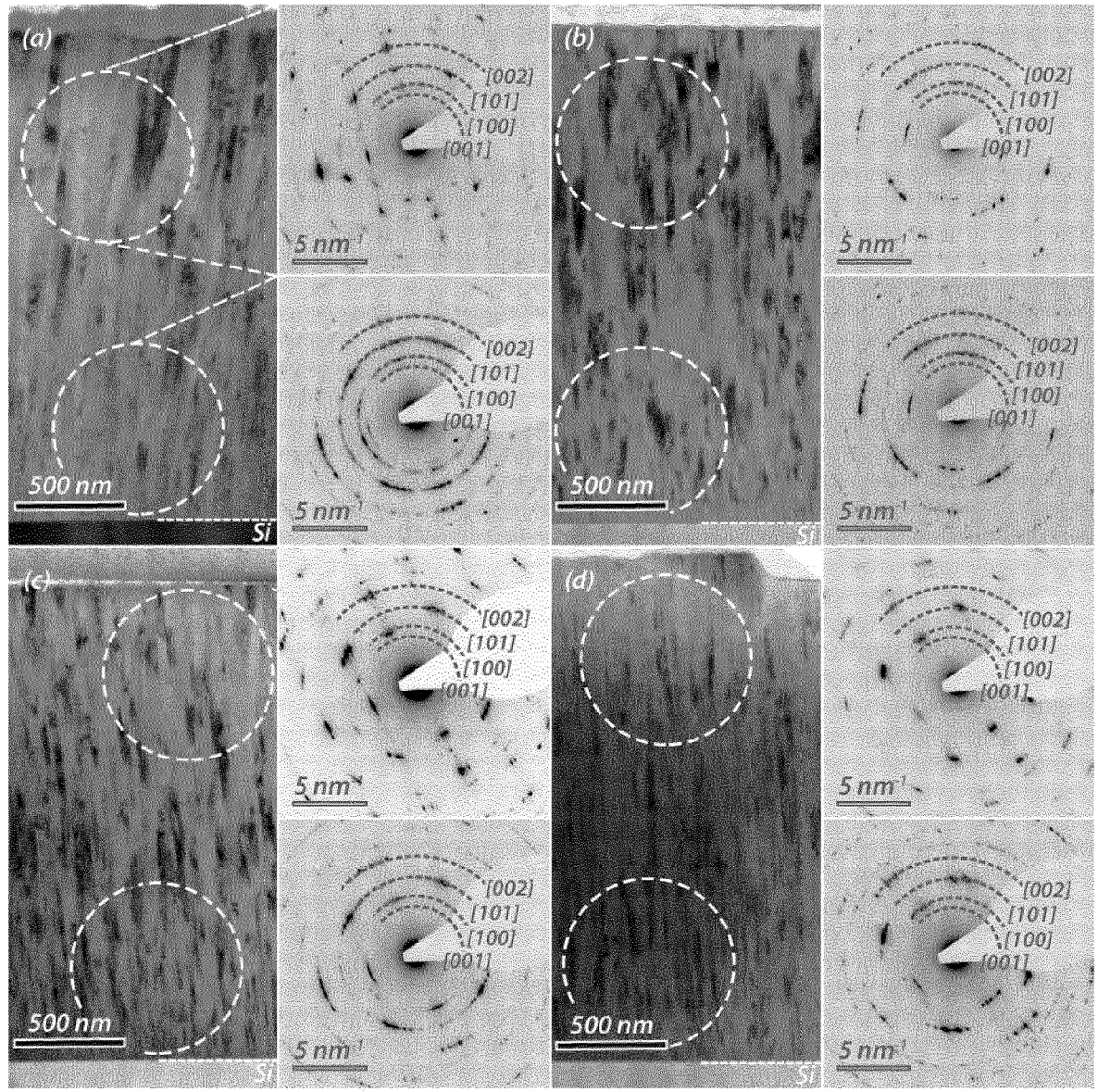
Figure 10:
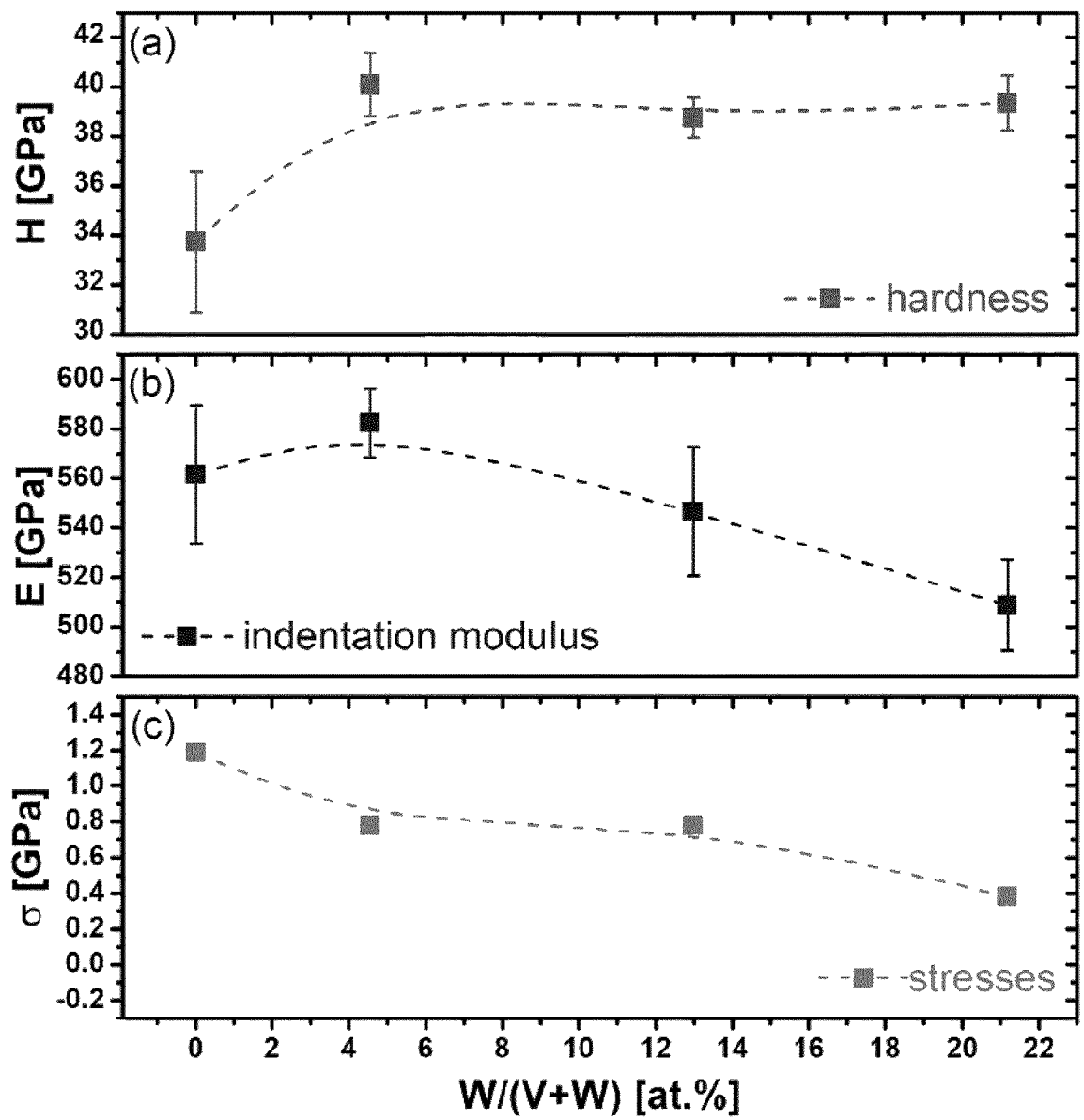

FIG. 10 shows the mechanical properties, including the hardness (a), indentation-modulus (b), and stresses (c), for the as-deposited coatings. Already by the small addition of approximately 5 at: % of W on the metal sublattice, the hardness (please see FIG. 10a) of $VB_2$ significantly increases from approximately 34 GPa to approximately 40 GPa. This rather huge increase can be referred to the formation of a solid solution and the strong texturing of the thin films. A computational study on $ReB_2$ and $OsB_2$ suggests the strong anisotropy of mechanical borides, stating that the highest hardness predominantly reflects the strength of bonds transversely oriented to the direction of indentation, hence the covalent B—B bonds [48]. By further increase of the tungsten content, the hardness stays fairly constant. Contrary to the hardness values, the indentation modulus shows the opposite trend. Starting with a small increase from approximately 560 GPa (α-$VB_2$) to approximately 580 GPa ($V_{0.95}W_{0.05}B_2$) the further addition of tungsten results in a decrease of the indentation modulus to approximately 500 GPa. Regarding empirical criteria, such as H/E and $H^3/E^2$ (describing the elastic to failure and resistance to plastic deformation), both would suggest an increase in wear resistance with increasing tungsten content. Regarding the stresses obtained via profilometry and the Stoney equation, the coatings show rather unusual (for PVD synthesized coatings) tensile stresses, due to the (BIAS)-potentially grounded substrates and the thermally induced stresses. Cooling down from the deposition temperature leads to a tensile stress component, which is in the order of approximately 1 GPa due to the differential thermal expansion coefficient between film and Si-substrate. For α-$VB_2$ the tensile stresses (at room temperature, after cooling down from the approximately 400° C. deposition temperature) are approximately 1.2 GPa, and with increasing tungsten content, these decrease to approximately 0.3 GPa. Consequently, the residual stresses at deposition temperature are becoming more compressive with increasing W content, which also leads to the formation of a finer columnar structure that is highly oriented, see FIG. 9.

FIG. 11a shows the results obtained via nanoindentation on the hardness dependent on the annealing temperature of the various deposited compositions. The trends cannot be explained by the chemical composition alone and are related with the morphology and residual stresses of the films. X-ray diffraction show no significant changes in structure for all temperatures and compositions. Whereas the binary α-$VB_2$ coating was delaminated after annealing at 800° C., all tungsten containing coatings remained on the substrate, therefore, no data are available for annealed α-$VB_2$. The coatings with 5 at: % and 13 at: % of W on the metal sublattice exhibit a decrease in hardness of 2 GPa after annealing at $T_a$=800° C., whereas the highest W alloyed coating ($V_{0.69}W_{0.21}B_2$) even exhibits an increase in H of approximately 2 GPa (to 42.5±0.9 GPa). All ternary coatings investigated, reveal their highest hardness after annealing between 1000° C. and 1200° C. For example, the highest W containing coating ($V_{0.69}W_{0.21}B_2$) shows an increase in hardness from the as deposited value of 39 GPa to 43 GPa when annealed for 1 h, which slightly decreases to 40 GPa (close to the as-deposited value) hardness when annealed for 1200 or 1400° C. (FIG. 11a).

Contrary to the hardness (which remained at the as deposited value, and even slightly increased when annealed to $T_a$≤1200° C.), the indentation modulus moderately decreases with increasing Ta from the as deposited value of 580, 550, and 500 GPa to 520, 480, and 480 GPa for $V_{0.95}W_{0.05}B_2$, $V_{0.87}W_{0.13}B_2$, and $V_{0.69}W_{0.21}B_2$, respectively, after annealing for 1 h at 1200° C. This even leads to the results, that H/E and $H^3/E^2$ values even increase with increasing annealing temperature (at least when annealed at Ta≤1200° C.), which is not a common result. X-ray diffraction studies (after the individual annealing temperatures) show no additional phases, and also the individual XRD peaks (representative for single-phase α-$V_{1-x}W_xB_2$) exhibit almost no change in their shape (not shown). This is in agreement with cross-sectional TEM studies, which are exemplied shown in FIGS. 12a and b, for the highest W containing coating ($V_{0.69}W_{0.21}B_2$) after vacuum-annealing for 1 h at 1000° C. and 1400° C., respectively.

These clearly indicate that even after annealing for 1 h at 1400° C., the _Fine-fibrous columnar growth morphology is still present. Hence, no recrystallization processes occurred, and the mean average column diameter only slightly increased from the as-deposited of 14.7±2.8 nm to 17.5±4.4 nm and further to 32.4±5.9 nm, when annealed at 1000° C. and 1400° C., respectively. While after annealing the defect-density is still high, see the HR-TEM image FIG. 12c, larger regions with significantly lower defect-density develop when annealed at 1400° C., FIG. 12d. The corresponding FFT study (FIG. 12d-I) still suggests for a single-phase solid solution α-$V_{1-x}W_xB_2$ structure, and the discrete spots highlight the relatively low defect-density.

All $V_{1-x}W_xB_2$ thin films were deposited using an unbalance magnetron sputtering system (laboratory-scaled AJA Orion 5) equipped with a 3-inch $VB_2$ (Plansee Composite Materials GmbH) as well as a 2-inch $W_2B_{5-x}$ compound target (Plansee Composite Materials GmbH) operated in Ar atmosphere (Ar with 99.999% purity). The working pressure was kept constant at 0.4 Pa and the temperature was set for all coatings to $T_{dep}$=700 C, corresponding to 390+/–10° C. at the substrates. Prior to the depositions, the silicon—(100) (21×7 mm$^2$) and sapphire—(10×10 mm$^2$) substrates were ultrasonically pre-cleaned in acetone and ethanol for 5 minutes each, mounted and heated up in the chamber. After an initial etching process for 10 minutes at 6.0 Pa, a target power of 8.7 W/cm$^2$ was applied to the 3-inch $VB_2$ target and on the 2-inch $W_2B_{5-x}$ cathode the target power was varied from 0 to 9.8 W/cm$^2$ achieving various compositions. The substrate holder was connected to ground to have almost a constant 0 V bias potential. To obtain the chemical composition of the $V_{1-x}W_xB_2$ thin films, the specimens were investigated by Time-of-Flight Elastic Recoil Detection Analysis (TOF-ERDA) with a recoil detection angle of 45° using an 36 MeV I$^{8+}$ ion beam. The Hardness (H) and Indentation modulus (E) were investigated via nanoindentation—using a UMIS Nanoindenter equipped with a Berkovich tip throughout the loading and unloading segments according to the procedure suggested by Oliver and Pharr. Transmission electron microscopy (TEM) investigations were carried out using a TECNAI F20 FEG TEM operated at 200 keV, equipped with an Apollo XLT2 energy dispersive X-ray spectroscopy (EDS) detector. Details on the structural evolution of the coatings were obtained by selected area electron diffraction (SAED). For the vacuum annealing treatments of our as-deposited coatings at temperatures ($T_a$) of 800; 1000; 1200, and 1400 C, we used a Centorr LF22-2000 vacuum furnace. The heating rate was set to 20 Kmin$^{-1}$ and after 1 h at the dwell temperature, the cooling was conducted passively (simply turning o the heater, which leads to>20 Kmin$^{-1}$).

Single-phase α-structured $V_{1-x}W_xB_2$ coatings with x=0, 0.05, 0.13, 0.21 were successfully deposited by DC magnetron co-sputtering of $VB_2$ and $WB_2$ compound targets. The coatings show a dense, columnar growth morphology, with a pronounced decrease in column diameter (from 14.7+/−2.8 nm to 32.4+/−5.9 nm) and increase in preferred growth orientation with increasing tungsten content. The addition of W to the metal sublattice of α-$VB_2$ leads to an increase in hardness from about 34 GPa to about 40 GPa and a decrease in tensile stresses from about 1.3 GPa to about 0.3 GPa. Simultaneously, the indentation modulus slightly decreases from about 560 GPa to about 500 GPa. All coatings studied are highly thermally stable, and even exhibit a hardness increase during vacuum annealing up to 1200 C for 1 h. Only when annealed for 1 h at 1400 C, the hardness decreases again. However, for the highest W containing coating ($V_{0.69}W_{0.21}B_2$), the hardness after annealing at 1400 C is still at the very high level of about 40 GPa. This coating exhibits its hardness maximum of about 43 GPa after annealing at 1000 C, where the mean average column diameter is still relatively small with 17.5 nm+/−4.4 nm, and the defect density is still rather high. Only when annealed at 1400 C, the column diameter is slightly increased (32.4 nm+/−5.9 nm) and the defect-density significantly is decreased. Based on our studies we can conclude, that ternary diborides, such as $V_{1-x}W_xB_2$, exhibit an incredible potential for the use in demanding applications. Only a limited number of materials still exhibit about 40 GPa hardness after vacuum-annealing for 1 h at 1400° C.

Preferably the hardness of the at least one ternary TM-diboride, preferably all ternary TM-diborides, stays higher than 30 GPa, preferably higher than 40 GPa measured by nanoindentation after annealing during 1 hour at a temperature between 800° C. and 1400° C. in vacuum atmosphere. This is valid for both VWB2 and TaWB2 systems. 30 GPa is already a high value at such a temperature- Preferably the hardness of the at least one ternary TM-diboride not drop below 40 GPa measured by nanoindentation after annealing during 1 hour at a temperature between 800° C. and 1400° C. in vacuum atmosphere. However preferably they all, especially VWB2 and TaWB2 systems, will stay higher than 30 GPa and for the investigated ternary borides with optimized chemical compositions, A hardness of above 40 GPa can be kept at these temperatures.

Preferably the hardness of the at least one ternary TM-diboride, preferably all ternary TM-diborides, undergoes age hardening effect during annealing during 1 hour at a temperature between 800° C. and 1400° C. in vacuum atmosphere. It preferably applies to both ternary boride systems. Both ternary boride systems show this effect. In an even more preferred example, this feature is valid for all ternary boride of this category.

Coating hardness, especially the age hardening effect according to claim 12, is expected to decrease during annealing processes as temperatures increases. This is due to relaxation and residual stress relieving as well as recrystallization and grain growth. The competing phenomenon which prevents hardness decrease or even can lead to further increase of hardness is phase transformation and phase separations happening at those elevated temperatures. As-deposited ternary borides synthesized here have a single a solid solution phase structure. At elevated temperatures during annealing it undergoes a phase transformation from a solid solution to a solid solution+α-$WB_2$ which cause hardening. This is similar to fcc-TiAlN à fcc-Ti(Al)N+fcc-AlN which causes hardening at elevated T.

FIGURE CAPTIONS

FIG. 1: Illustrations of crystallization with SG-191 (AlB$_2$ prototype) and crystallization with SG-194 ($W_2B_5$ prototype), respectively; (a) Concept of α-$WB_{2-z}$ phase stabilization due to alloying with metastable α-$TaB_{2-z}$; (b) Comparison on the energy of formation, $E_f$, of the ternary $W_{1-x}Ta_xB_2$ in relation to their Ta content. The full lines correspond to perfect structures, whereas the dashed lines correspond to the boron-defected crystals. Schottky-defects (vacancy concentration of 10 at. %) for the binary systems are labeled with triangular symbols. The red and green symbols correspond to the ω- and α-structure, respectively.

Figure 2:
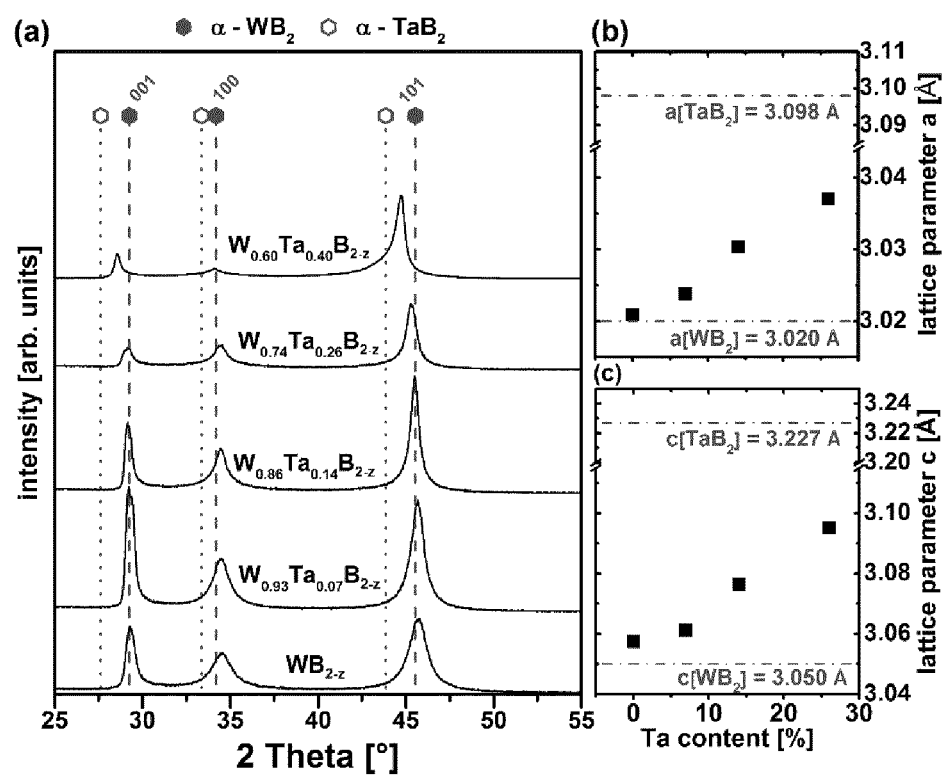

FIG. 2: (a) Structural evolution of the as deposited $W_{1-x}Ta_xB_2$-z powdered coating materials with increasing Ta content (x=0, 0.07, 0.14, 0.26, 0.40). The 2Θ peak positions for standardized α-WB2 (α=3.020 Å, c=3.050 Å) [34] and α-TaB2 (α=3.098 Å, c=3.227 Å) [35] are indicated with filled and opened hexagonal symbols, respectively. Stress free lattice parameters (a and c) of the single-phased coatings (annealed at Ta=800° C. for 16 h in vacuum to ensure stress free states which are actually in excellent agreement to the as deposited values) with increasing Ta content are presented in (b) and (c), respectively.

FIG. 3: Structural evolution of the $W_{1-x}Ta_xB_2$-z (x=0, 0.07, 0.14, 0.26) coating powders with increasing annealing temperatures. The 2Θ peak positions for standardized α-WB2 (a=3.020 Å, c=3.050 Å) [34], ω-W2B5-z (a=2.983 Å, c=13.879 Å) [36] and t-WB (α=3.117 Å, c=16.910 Å) [37] are indicated with full green and open red hexagonal symbols, as well as black filled squares, respectively.

Figure 4:
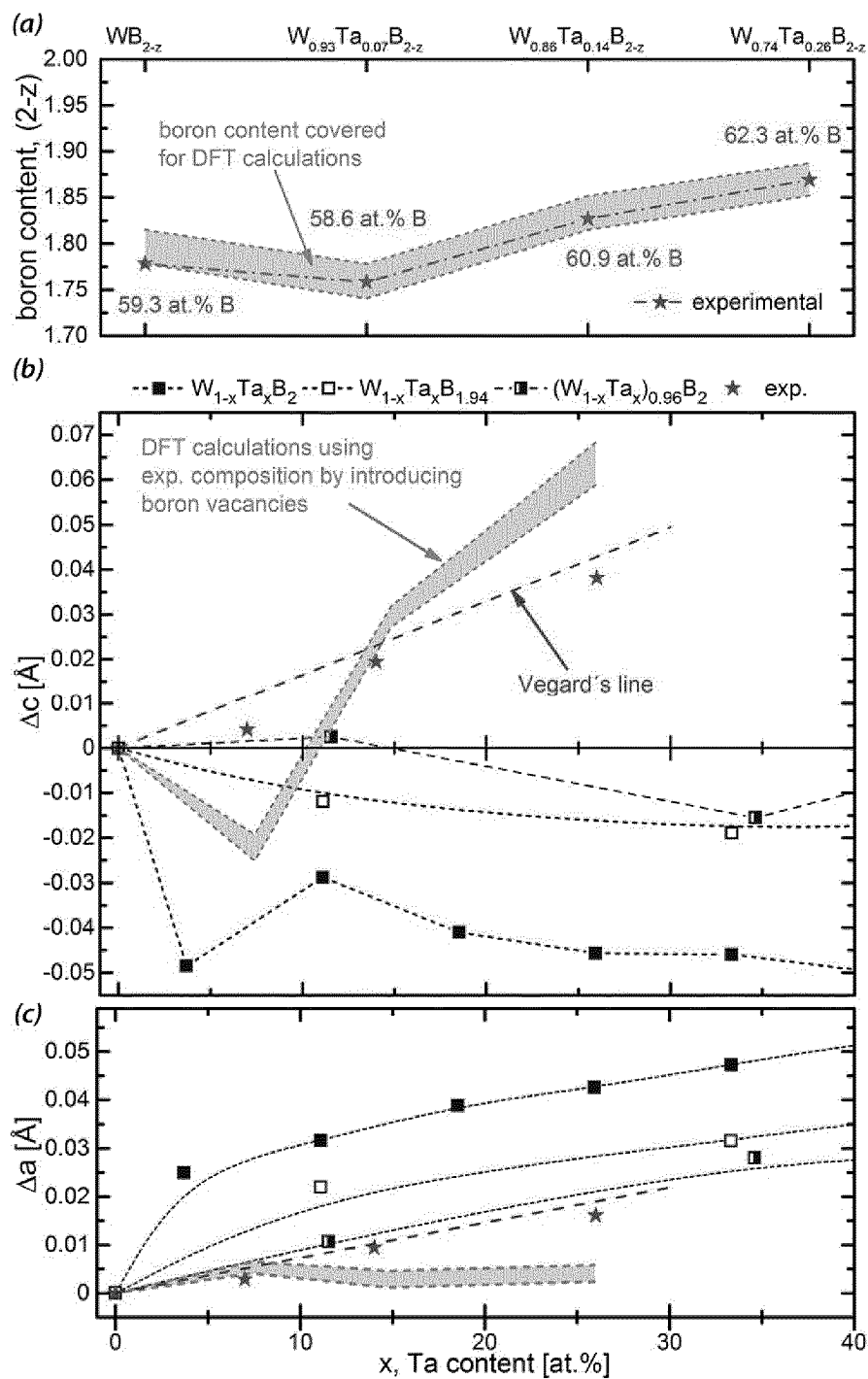

FIG. 4: (a) Boron content of the selected compositions analyzed by elastic recoil detection analysis (ERDA). (b) Change in lattice parameter c and a (c) obtained from DFT. The filled blue squares indicate the data obtained for a perfect (non-defected) cell. The blue half-filled and open symbols indicate the change in lattice parameter for metal and boron defected structures, respectively. The ocher symbols indicate the experimental data. The grey area represents the change in lattice parameter a and c, for the boron-defected cells achieving the experimental composition by DFT.

Figure 5:
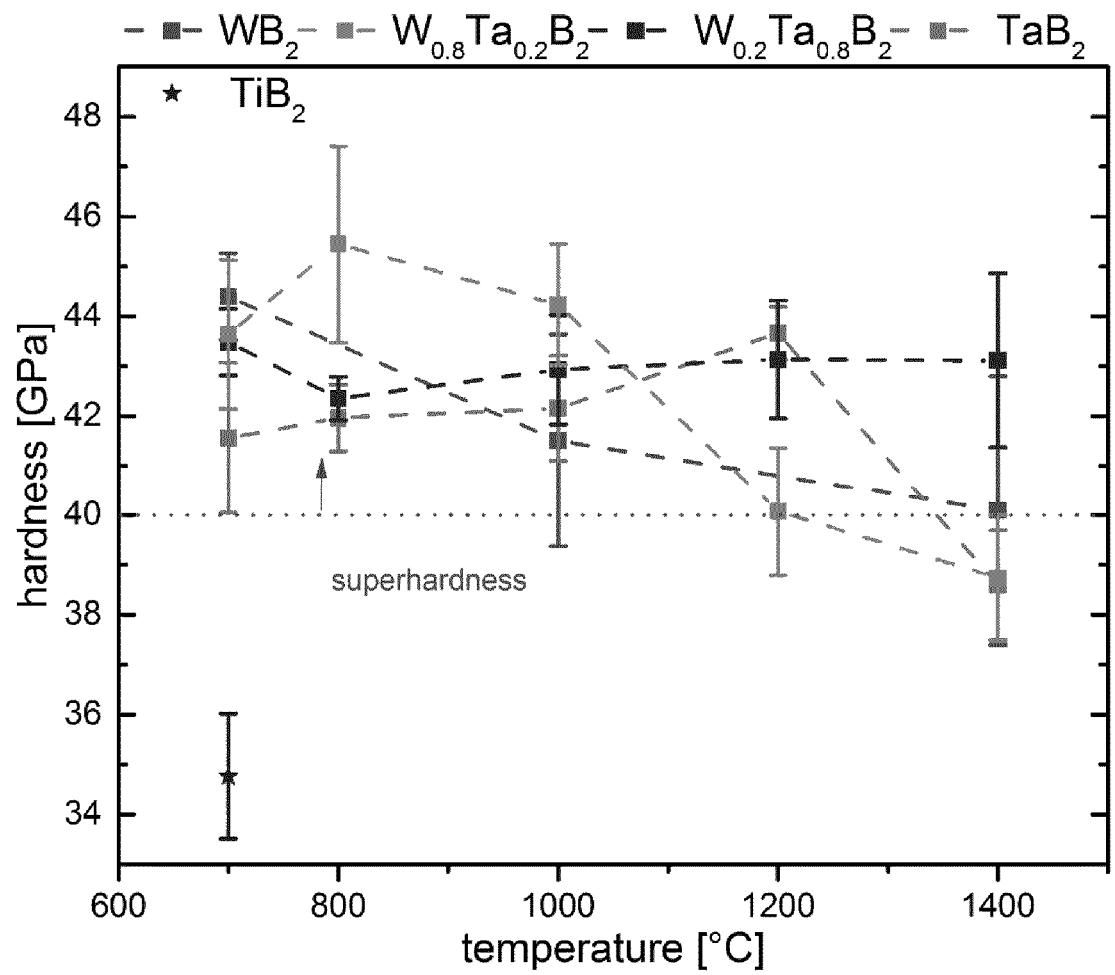

FIG. 5: Behavior of hardness of the $W_{1-x}Ta_xB_2$ coating films with increasing temperature measured by nanoindentation after annealing of the coated samples at 800° C., 1000° C., 1200° C. and 1400° C., respectively.

Figure 6:
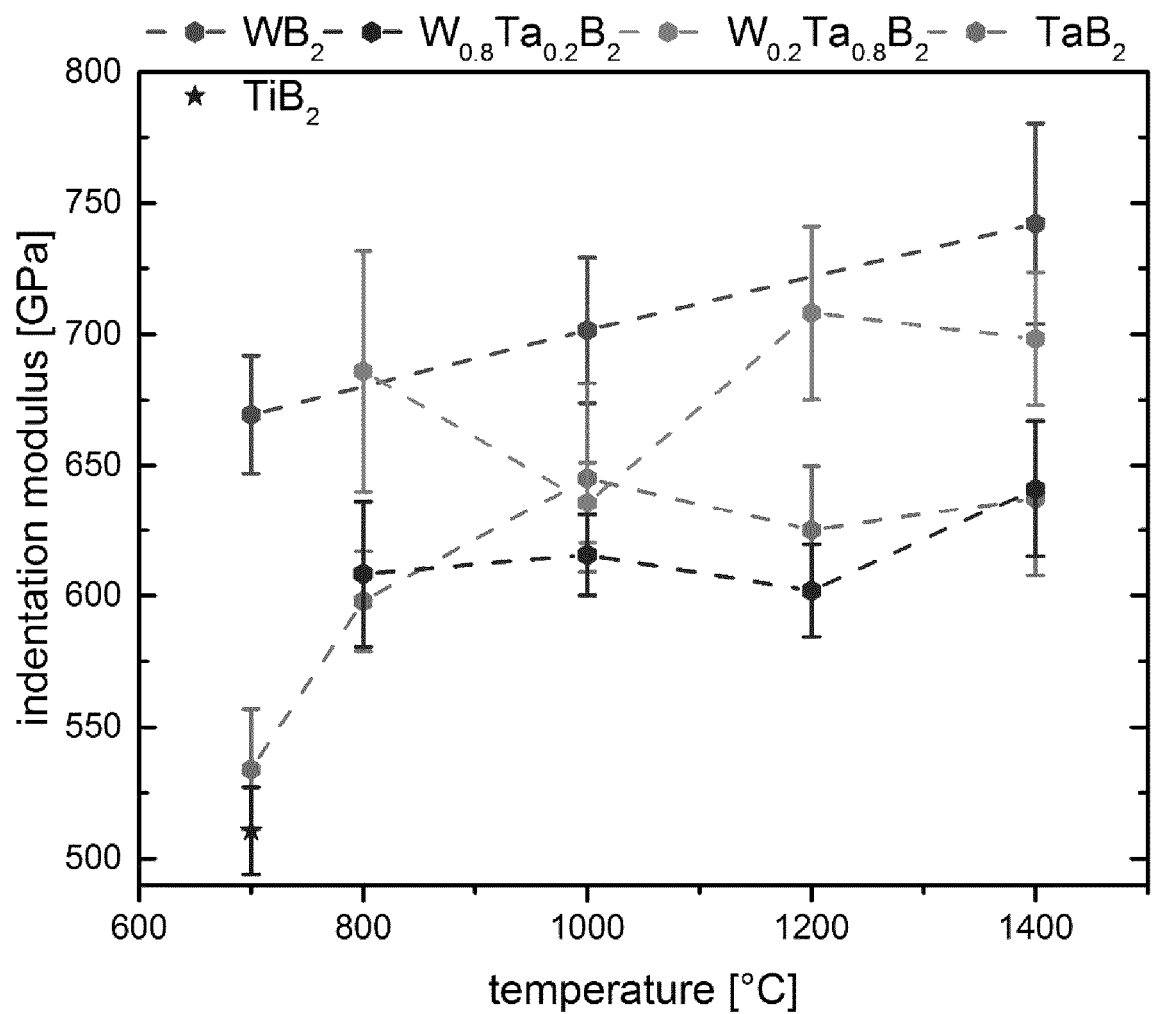

FIG. 6: Behavior of Young's modulus of the $W_{1-x}Ta_xB_2$ coating films with increasing temperature measured by nanoindentation after annealing of the coated samples at 800° C., 1000° C., 1200° C. and 1400° C., respectively.

Figure 7:
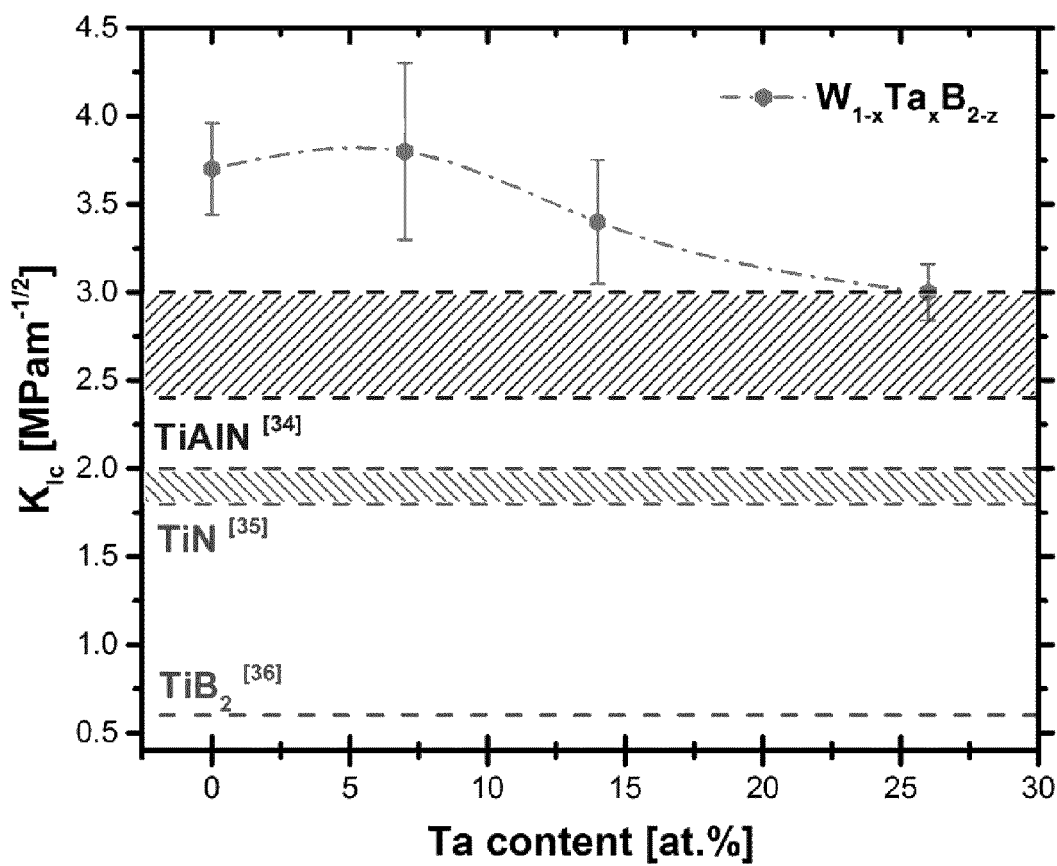

FIG. 7: Fracture Toughness (KIC) of $W_{1-x}Ta_xB_{2-z}$ coating films.

The figure shows the fracture toughness values as a result of micromechanical bending tests for single-phased α-WB1.78 (59.3 at. % B), α-$W_{0.93}Ta_{0.07}$B1.76 (58.6 at. % B), α-$W_{0.86}Ta_{0.14}$B1.83 (61.1 at. % B), and α-$W_{0.74}Ta_{0.26}$B1.87 (62.3 at. % B). It can be clearly seen, that the data reveals a decreasing tendency (~ from 3.7 to 3 MPam-½) with increasing tantalum content. A maximum KIC value of 3.8±0.5 GPam-½ was determined for the W0.93Ta0.07B1.76 material composition but simultaneously reveals the highest error bar. Comparing the KIC values of coatings with recently published fracture toughness results obtained for TiAlN[35] and TiN[36] it can clearly be seen, that it can be improved by 130 or 200%, respectively. The values of fracture toughness shown in FIG. 7 regarding TiB2 thin films are obtained from the literature.

FIGS. 5 and 6 show the hardness and Young's modulus (elastic modulus) measured by nanoindentation after annealing of samples coated with WB2, $W_{0.8}Ta_{0.2}B_2$, $W_{0.2}Ta_{0.8}B_2$ and TaB2. Vacuum annealing was conducted in each case (at each respective annealing temperature).

Exceptional high hardness values up to 1400° C. for all coatings were measured. Superhardness (corresponding to hardness values above 40 GPa) was observed by both $W_{0.8}Ta_{0.2}B_2$ and $W_{0.2}Ta_{0.8}B_2$ coating films even after annealing at 1200° C.

The oxidation resistance and thermal behavior, which are essential to ensure high performance in different applications were analyzed.

Analysis of the structure and mechanical properties of the inventive coating films reveals the potential of this material combination, by reaching superhardness level and allowing for phase transformation induced toughening effects.

FIG. 7 shows the fracture toughness values as a result of micromechanical bending tests for single-phased α-WB1.78 (59.3 at. % B), α-W0.93Ta0.07B1.76 (58.6 at. % B), α-W0.86Ta0.14B1.83 (61.1 at. % B), and α-W0.74Ta0.26B1.87 (62.3 at. % B). It can be clearly seen, that the data reveals a decreasing tendency (~ from 3.7 to 3 MPam-½) with increasing tantalum content. A maximum KIC value of 3.8±0.5 GPam-½ was determined for the W0.93Ta0.07B1.76 material composition but simultaneously reveals the highest error bar. Comparing the KIC values of the inventive coatings with recently published fracture toughness results obtained for TiAlN[39] and TiN [40] it can clearly be seen, that it can be improved by 130 or 200%, respectively. Unfortunately, TiB2 thin films—in terms of fracture toughness—is rather poor investigated and a single value of 0.6 MPam-½ can be compared to the obtained data. Moreover, no details on the measurement setup can be given [37].

Figure 8:
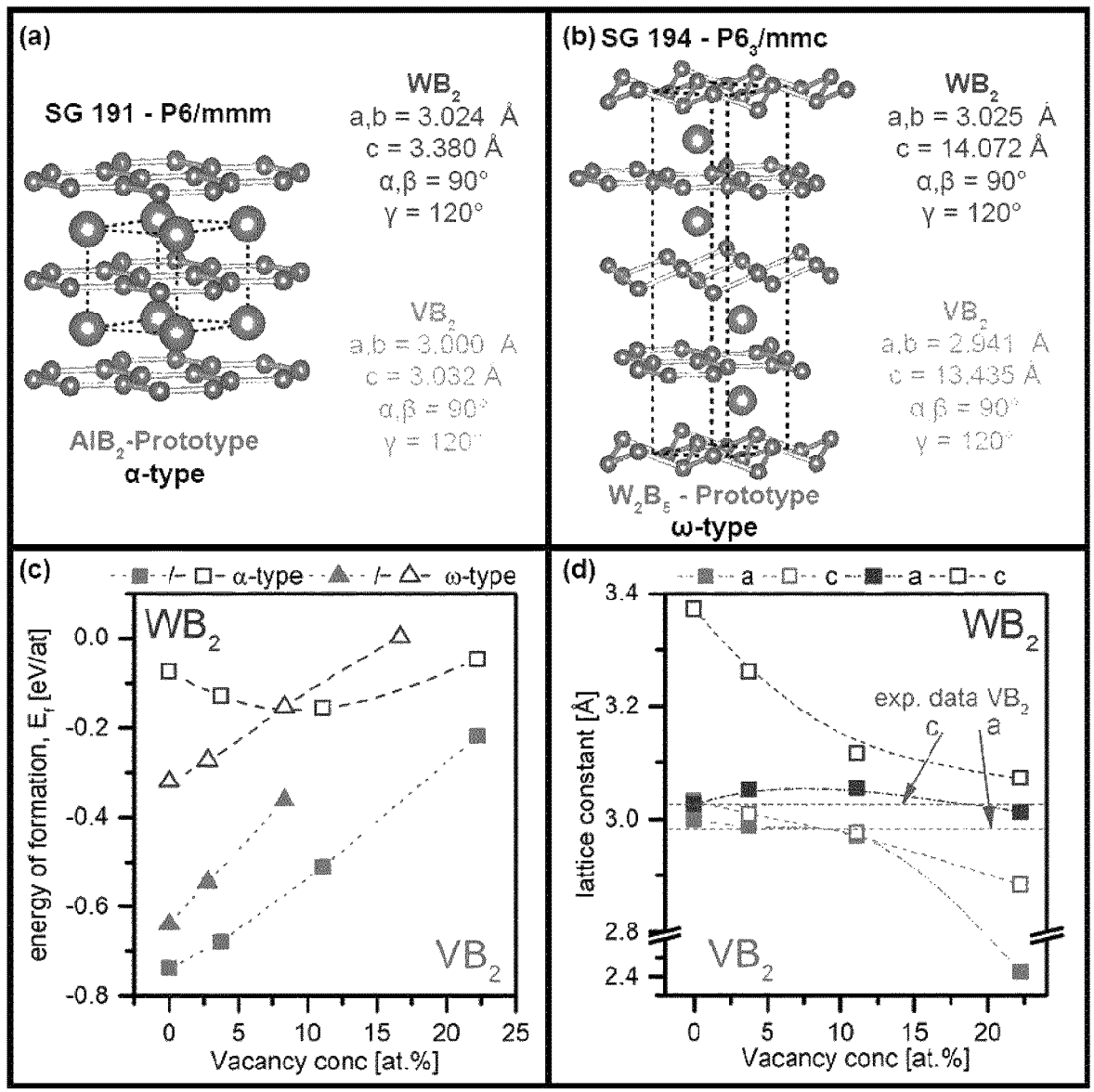

FIG. 8: (a) Crystal structure and the corresponding lattice constants calculated via DFT for $VB_2$ and $WB_2$ when crystallizing in either the $AlB_2$-(α-prototype) (a) or $W_2B_{5-x}$-prototype (ω-prototype) (b). (c) Energy of formation, $E_f$, as well as (d) lattice constant as a function of the vacancy concentration (also considering Schottky-defects) for $VB_2$ and $WB_2$. In (d) full symbols denote to the lattice constant a, whereas open symbols refer to c.

FIG. 9: Cross-sectional transmission electron microscopy (TEM) studies including selected area electron diffraction patterns (SAED) of surface and substrate near regions from as-deposited (a) $VB_2$, (b) $V_{0.95}W_{0.05}B_2$, (c) $V_{0.87}W_{0.13}B_2$, and (d) $V_{0.79}W_{0.21}B_2$. The green dashed lines within the SAED patterns represent the diffraction rings when simply using Vegard's linear approximation for solid solutions between $VB_2$ and $WB_2$.

FIG. 10: (a) Hardness (H), (b) indentation modulus (E), and (c) residual stresses (σ) of our as-deposited single phased $V_{1-x}W_xB_2$ coatings with x32 0, 0.05, 0.13, and 0.21. The stresses are obtained by curvature measurements of coated Si substrates whereas the indentation experiments were conducted on coated sapphire substrates.

Figure 11:
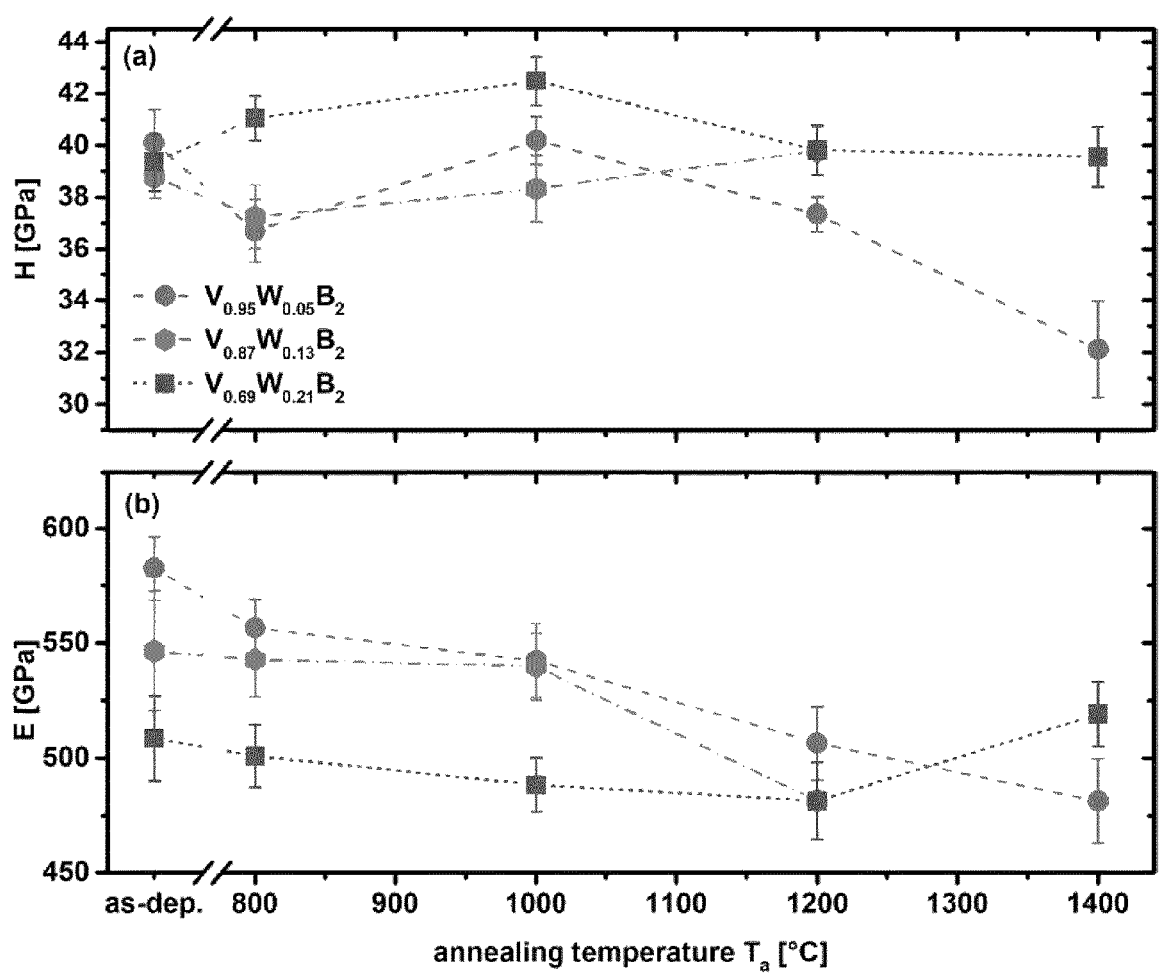

FIG. 11: (a) Hardness (H) and (b) indentation modulus (E) of our $V_{0.95}W_{0.05}B_2$ (yellow circular symbols), $V_{0.87}W_{0.13}B_2$ (grey hexagonal symbols), and $V_{0.69}W_{0.21}B_2$ (green cubic symbols) after vacuum-annealing for 1 h at $T_a$.

Figure 12:
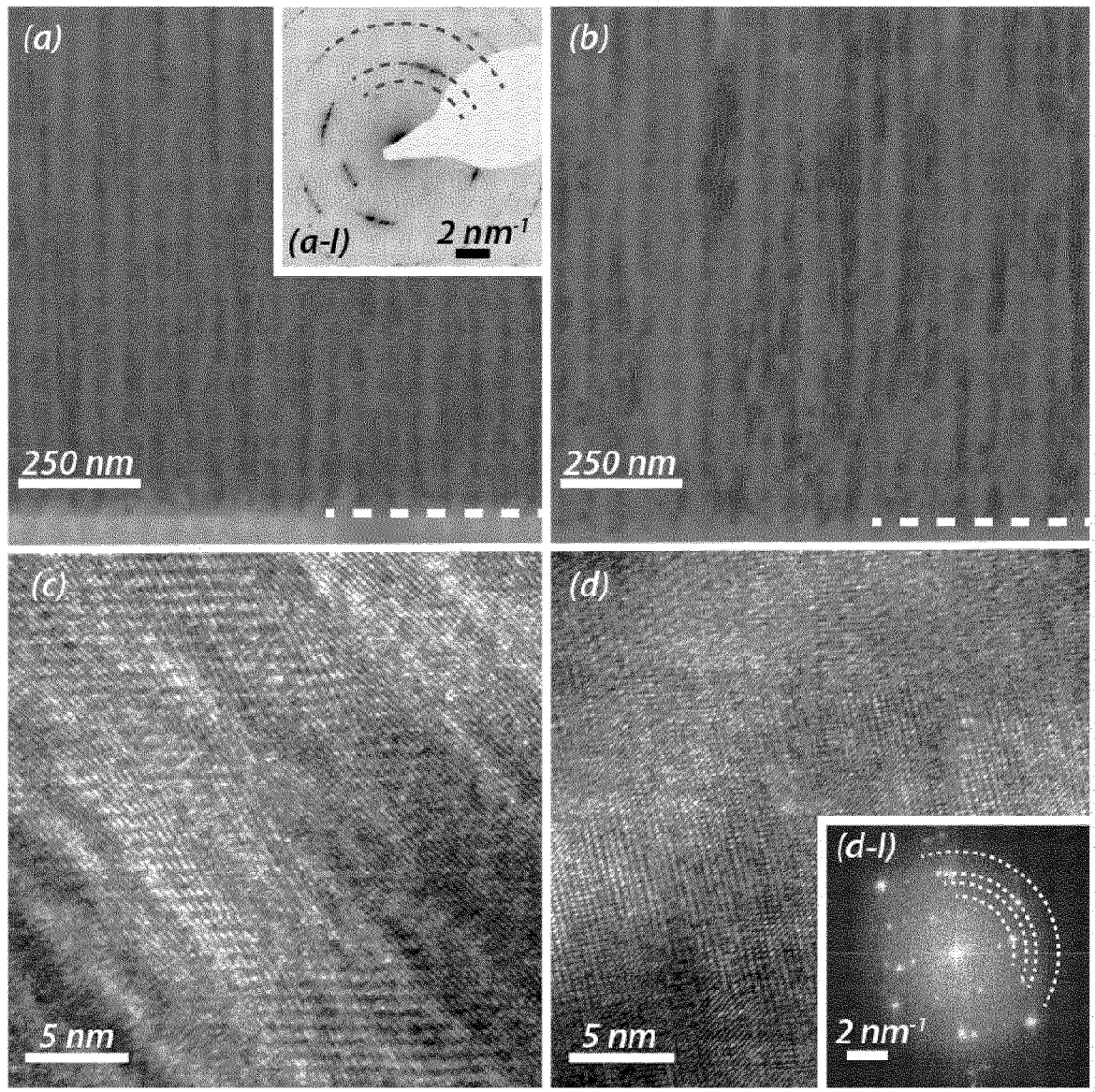

FIG. 12: Cross-sectional transmission electron microscopy (TEM) studies of $V_{0.69}W_{0.21}B_2$ after annealing at Ta=1000° C. (a) and 1400° C. (b), with corresponding higher resolution images (c, and d, after Ta=1000 and 1400° C.), and an FFT of FIG. 12(d) in (d-1).

REFERENCES

[1] C. Mitterer, J. Solid State Chem. 133 (1997) 279-291.
[2] K. W. Lee, Y.-H. Chen, Y.-W. Chung, L. M. Keer, Surf. Coat. Technol. 177-178 (2004) 591-596.
[3] N. Nedfors, A. Mockute, J. Palisaitis, P. O. Å. Persson, L.-Å. Näslund, J. Rosen, Surf. Coat. Technol. 304 (2016) 203-210.
[4] M. Shibuya, M. Kawata, M. Ohyanagi, Z. A. Munir, J. Am. Ceram. Soc. 86 (2003) 706-710.

[5] C. Buzea, T. Yamashita, Supercond. Sci. Technol. 14 (2001) R115.
[6] S. Oktay, Z. Kahraman, M. Urgen, K. Kazmanli, Appl. Surf. Sci. 328 (2015) 255-261.
[7] W. Münz, J. Vac. Sci. Technol. A 4 (1986) 2717-2725.
[8] W. Kalss, A. Reiter, V. Derflinger, C. Gey, J. L. Endrino, International Journal of Refractory Metals and Hard Materials 24 (2006/9) 399-404.
[9] P. H. Mayrhofer, A. Kirnbauer, P. Ertelthaler, C. M. Koller, Scr. Mater. 149 (2018/5) 93-97.
[10] P. H. Mayrhofer, C. Mitterer, J. G. Wen, J. E. Greene, I. Petrov, Appl. Phys. Lett. 86 (2005) 1-3.
[11] N. Nedfors, O. Tengstrand, J. Lu, P. Eklund, P. O. Å. Persson, L. Hultman, U. Jansson, Surf. Coat. Technol. 257 (2014) 295-300.
[12] H.-Y. Chung, M. B. Weinberger, J. B. Levine, R. W. Cumberland, A. Kavner, J.-M. Yang, S. H. Tolbert, R. B. Kaner, Science 316 (2007) 436-439.
[13] X. Hao, Y. Xu, Z. Wu, D. Zhou, X. Liu, X. Cao, J. Meng, Phys. Rev. B Condens. Matter 74 (2006) 224112.
[14] H. Euchner, P. H. Mayrhofer, Thin Solid Films 583 (2015) 46-49.
[15] V. Moraes, H. Riedl, C. Fuger, P. Polcik, H. Bolvardi, D. Holec, P. H. Mayrhofer "submitted Manuscript"
[16] D. G. Pettifor, Mater. Sci. Technol. 8 (1992) 345-349.
[17] S. F. Pugh, The London, Edinburgh, and Dublin Philosophical Magazine and Journal of Science 45 (1954) 823-843.
[18] M. A. Ali, M. A. Hadi, M. M. Hossain, S. H. Naqib, A. K. M. A. Islam, Phys. Status Solidi (2017).
[19] S. H. Mir, P. C. Jha, M. S. Islam, A. Banarjee, W. Luo, S. D. Dabhi, P. K. Jha, R. Ahuja, Sci. Rep. 6 (2016) 29309.
[20] H. P. Woods, F. E. Wawner Jr, B. G. Fox, Science 151 (1966) 75.
[21] H. Euchner, P. H. Mayrhofer, H. Riedl, F. F. Klimashin, A. Limbeck, P. Polcik, S. Kolozsvari, Acta Mater. 101 (2015) 55-61.
[22] Y. M. Liu, C. L. Jiang, Z. L. Pei, H. Lei, J. Gong, C. Sun, Surf. Coat. Technol. 245 (2014) 108-116.
[23] C. Jiang, Z. Pei, Y. Liu, J. Xiao, J. Gong, C. Sun, Phys. Status Solidi 210 (2013) 1221-1227.
[24] P. Li, I.-W. Chen, J. E. Penner-Hahn, J. Am. Ceram. Soc. 77 (1994) 118-128.
[25] M. Leoni, R. L. Jones, P. Scardi, Surf. Coat. Technol. 108-109 (1998) 107-113.
[26] A. J. Perry, J. Vac. Sci. Technol. A 6 (1988) 2140-2148.
[27] M. Dahlqvist, U. Jansson, J. Rosen, J. Phys. Condens. Matter 27 (2015).
[28] G. Kresse, D. Joubert, Phys. Rev. B Condens. Matter 59 (1999) 1758-1775.
[29] G. Kresse, J. Furthmüller, Phys. Rev. B Condens. Matter 54 (1996) 11169-11186.
[30] J. P. Perdew, K. Burke, M. Ernzerhof, Phys. Rev. Lett. 77 (1996) 3865-3868.
[31] A. van de Walle, M. Asta, G. Ceder, CALPHAD 26 (2002) 539-553.
[32] S. Motojima, K. Sugiyama, J. Mater. Sci. 14 (1979) 2859-2864.
[33] L. Vegard, Zeitschrift Für Physik 5 (1921) 17-26.
[34] Powder Diffraction File 04-003-6624, International Center for Diffraction Data, 2011 WB2191.
[35] Powder Diffraction File 00-038-1462, International Center for Diffraction Data, 2011TaB2191.
[36] Powder Diffraction File 04-007-1000, International Center for Diffraction Data, 2011 WB2194.
[37] Powder Diffraction File 00-035-0738, International Center for Diffraction Data, 2011 WB.
[38] M. Bartosik, C. Rumeau, R. Hahn, Z. L. Zhang, and P. H. Mayrhofer, "Fracture toughness and structural evolution in the TiAlN system upon annealing," Sci. Rep., vol. 7, no. 1, pp. 1-9, 2017.
[39] R. Daniel et al., "Grain boundary design of thin films: Using tilted brittle interfaces for multiple crack deflection toughening," Acta Mater., vol. 122, pp. 130-137, January 2017.
[40] M. Rydzewski et al., "The Impact of Negative Bias Substrate to Fracture Toughness and Hardness of TiB2 Sputtering Coatings," TANGER Ltd., no. 1, pp. 1-2, 2017.
[41]. P. Wang, R. Kumar, E. M. Sankaran, X. Qi, X. Zhang, D. Popov, A. L. Cornelius, Li, Y. Zhao, and L. Wang, Inorg. Chem. 57, 1096 (2018).
[42]. X. Zhou, H. Zhang, C. Cheng, J. Gao, G. Xu, Y. Li, and Y. Luo, Physica B Condens. Matter 404, 1527 (2009).
[43]. A. Erdemir, M. Halter, and G. R. Fenske, Wear 205, 236 (1997).
[44]. V. Moraes, C. Fuger, V. Paneta, D. Primetzhofer, P. Polcik, H. Bolvardi, M. Arndt, H. Riedl, and P. H. Mayrhofer, Scr. Mater. 155, 5 (2018).
[45]. M. Ruhle, N. Claussen, and A. H. Heuer, J. Am. Ceram. Soc. 69, 195 (1986).
[46]. Y. Al-Khatatbeh, K. K. M. Lee, and B. Kiefer, Phys. Rev. B Condens. Matter 81, 214102 (2010).
[47]. V. Moraes, H. Riedl, C. Fuger, P. Polcik, H. Bolvardi, D. Holec, and P. H. Mayrhofer, Sci. Rep. 8, 975 (2018).
[48]. A. Šimůnek, Phys. Rev. B Condens. Matter 80, 060103 (2009)

What is claimed is:

1. A coated substrate comprising a substrate surface coated with a coating comprising at least one ternary TM-diboride coating film, wherein the at least one ternary TM-diboride coating film comprises two different transition metals, and the at least one ternary TM-diboride coating film has a chemical composition described by the formula $W_{1-x}Ta_xB_{2-z}$, or by the formula $V_{1-x}W_xB_2$ with $0.05 \leq x \leq 0.45$ and $-0.03 \leq z \leq 0.03$, wherein the coefficients correspond to mol fractions.

2. The coated substrate according to claim 1, wherein a first of the two transition metals is tungsten, tantalum or vanadium.

3. The coated substrate according to claim 2, wherein a second of the two transition metals is tungsten, tantalum or vanadium.

4. The coated substrate according to claim 1, wherein a chemical composition of the at least one ternary TM-diboride coating film is described by the formula $W_{1-x}Ta_xB_{2-z}$, or by the formula $V_{1-x}W_xB_2$ with $0.05 \leq x \leq 0.26$.

5. The coated substrate according to claim 1, wherein a singular ternary phase of diboride of each of the two transition metals is present in the at least one ternary TM-diboride coating film.

6. The coated substrate according to claim 4, wherein a singular α-phase of diboride of each of the two transition metals is present in the at least one ternary TM-diboride coating film.

7. A method for producing the coated substrate according to claim 2, comprising preparing ternary $W_{1-x}Ta_xB_{2-z}$ coating films by sputtering targets comprising tungsten diboride, $WB_2$, and tantalum diboride, $TaB_2$, respectively, in an argon-containing atmosphere in an interior of a vacuum chamber comprising at least one substrate to be coated for depositing the at least one ternary TM-diboride coating film on the substrate surface, or preparing $V_{1-x}W_xB_2$ thin films by sputtering targets comprising vanadium diboride, $VB_2$, and tungsten boride, $W_2B_{5-x}$, respectively, in an argon-containing atmosphere in an interior of a vacuum chamber comprising at least one substrate to be coated for depositing the at least one ternary TM-diboride coating film on the substrate surface.

8. The coated substrate according to claim 1, wherein the coated substrate is a forming tool or a cutting tool or a component.

9. The coated substrate according to claim 1, wherein the coated substrate is a part of a forming tool or a cutting tool or a component.

10. The coated substrate according to claim 1, wherein a hardness of the at least one ternary TM-diboride stays higher than 30 GPa measured by nanoindentation after annealing during 1 hour at a temperature between 800° C. and 1400° C. in vacuum atmosphere.

11. The coated substrate according to claim 2, wherein a hardness of the at least one ternary TM-diboride undergoes an age hardening effect during annealing during 1 hour at a temperature between 800° C. and 1400° C. in vacuum atmosphere.

* * * * *